United States Patent
Park et al.

(10) Patent No.: US 7,672,160 B2
(45) Date of Patent: Mar. 2, 2010

(54) 3-LEVEL NON-VOLATILE SEMICONDUCTOR MEMORY DEVICES AND RELATED METHODS

(75) Inventors: Min Gun Park, Gyeonggi-do (KR); Kyong Ae Kim, Gyeonggi-do (KR); Sang Won Hwang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 27 days.

(21) Appl. No.: 11/655,518

(22) Filed: Jan. 19, 2007

(65) Prior Publication Data

US 2007/0183197 A1 Aug. 9, 2007

(30) Foreign Application Priority Data

Jan. 25, 2006 (KR) .................... 10-2006-0007817

(51) Int. Cl.
  *G11C 16/04* (2006.01)
(52) U.S. Cl. ............................ 365/185.03; 365/185.18; 365/185.17; 365/185.08; 365/185.22; 365/185.05
(58) Field of Classification Search ............ 365/185.18, 365/185.03, 185.17, 185.08, 185.22, 185.05
  See application file for complete search history.

(56) References Cited

U.S. PATENT DOCUMENTS

| 6,847,550 B2 * | 1/2005 | Park ....................... 365/185.03 |
| 6,982,904 B2 | 1/2006 | Shiga |
| 2005/0111288 A1 * | 5/2005 | Shibata et al. .............. 365/232 |
| 2005/0174841 A1 * | 8/2005 | Ho ......................... 365/185.03 |
| 2006/0104117 A1 * | 5/2006 | Kameda ................. 365/185.18 |
| 2006/0279993 A1 * | 12/2006 | Shibata ................... 365/185.17 |

FOREIGN PATENT DOCUMENTS

| JP | 11250676 | 9/1999 |
| KR | 1020010070086 | 7/2001 |
| KR | 1020050007653 | 1/2005 |
| KR | 10-2005-94569 | 9/2005 |

OTHER PUBLICATIONS

KR-1020040085616, Kim, Semiconductor Memory Device, Aug. 10, 2005, all pages.*

* cited by examiner

*Primary Examiner*—Hoai V Ho
*Assistant Examiner*—Fernando N Hidalgo
(74) *Attorney, Agent, or Firm*—Myers Bigel Sibley & Sajovec, P.A.

(57) ABSTRACT

A non-volatile semiconductor memory device may include a memory cell array and a controller coupled to the memory cell array. The memory cell array may include first and second memory cells coupled to respective first and second word lines. Each of the first and second memory cells may be configured to be programmed to one of a first, a second, or a third threshold voltage so that the first and second memory cells provide nine different threshold voltage combinations. The controller may be configured to provide a mapping of data of a set of three binary bits providing eight different data combinations to eight of the nine different threshold voltage combinations provided by the first and second memory cells. The controller may be further configured to write data of first, second, and third binary bits to the first and second memory cells by programming each of the first and second memory cells to a respective one of the first, second, or third threshold voltages using the mapping of data. Related methods are also discussed.

11 Claims, 14 Drawing Sheets

| WORD LINE | VOLTAGE LEVEL |
|---|---|
| WLD<2> | FIRST REFERENCE VOLTAGE VR1 |
| WLU<2> | SECOND REFERENCE VOLTAGE VR2 |
| REMAINING WORD LINES | PASS VOLTAGE VPASS |

FIG. 14

3-LEVEL NON-VOLATILE SEMICONDUCTOR MEMORY DEVICES AND RELATED METHODS

RELATED APPLICATION

The present application claims the benefit of priority from Korean Application No. 10-2006-7817 filed in the Korean Intellectual Property Office on Jan. 25, 2006, the disclosure of which is hereby incorporated herein in its entirety by reference.

FIELD OF THE INVENTION

The present invention relates generally to a semiconductor memory device and, more particularly, to a 3-level non-volatile semiconductor memory device having 3-level memory cells and a driving method therefor.

BACKGROUND

A non-volatile semiconductor memory device preserves stored data even when power is interrupted. Various types of memory cells suitable for non-volatile semiconductor memory devices are known, one of which is a single transistor type memory cell.

Generally, a single transistor type memory cell MC, as illustrated in FIG. 1, includes: a current channel between source and drain regions of a semiconductor substrate; a floating gate FG between a dielectric oxide DOX and a gate oxide GOX; and a control gate CG. The floating gate FG traps electrons, and the trapped electrons establish a threshold voltage. When the non-volatile semiconductor memory device performs a read operation, the threshold voltage of the memory cell is sensed, so that stored data may be recognized.

Conventionally, program and erase operations may be repeatedly performed in the memory cells of a non-volatile semiconductor memory device. At this time, various functions of a single transistor memory cell MC may be determined by various types of supplied voltages. In the single transistor memory cell MC, electrons move into a floating gate FG to program the single transistor memory cell. The electrons that move into the floating gate FG may be generated by Fowler-Nordheim tunneling FN, electron injection, or the like. Electron injection may be performed by Channel Hot-Electron injection or Channel-Initiated Secondary Electron Injection. Furthermore, Fowler-Nordheim tunneling is widely used in flash memory devices to erase all data at once.

Conventionally, a transistor memory cell stores one of two data values. The two data values may be determined by a threshold voltage which is set to one of two levels, as illustrated in FIG. 2. For example, when the threshold voltage of a memory cell is less than a reference voltage VM, data is read as "1", and when the threshold voltage of the memory cell is greater than the reference voltage VM, data is read as "0".

To provide increased integration of semiconductor memory devices, 4-level memory cells have been developed. A 4-level memory cell may be programmed with one of four threshold voltage levels, as illustrated in FIG. 3. As a result, a 4-level memory cell can store data having any one of four different values. Therefore, a non-volatile semiconductor memory device (hereinafter referred to as a '4-level non-volatile semiconductor memory device') having such 4-level memory cells may have data storage capability twice that of a non-volatile semiconductor memory device (hereinafter referred to as a '2-level non-volatile semiconductor memory device') having 2-level memory cells.

In a 4-level memory cell, a margin of threshold voltages between neighboring levels may conventionally be about 0.67 V, which is relatively low. Meanwhile, a threshold voltage of a memory cell may shift due to leakage of electrons. Therefore, the threshold voltage of a programmed memory cell MC may shift to a neighboring threshold voltage level. As a result, reliability of a 4-level non-volatile semiconductor memory device may be reduced relative to a 2-level non-volatile semiconductor memory device.

SUMMARY

According to some embodiments of the present invention, a non-volatile semiconductor memory device may include a memory cell array and a controller coupled to the memory cell array. The memory cell array may include first and second memory cells coupled to respective first and second word lines, and each of the first and second memory cells may be configured to be programmed to one of a first, a second, or a third threshold voltage so that the first and second memory cells provide nine different threshold voltage combinations. The controller may be configured to provide a mapping of data of a set of three binary bits providing eight different data combinations to eight of the nine different threshold voltage combinations provided by the first and second memory cells. The controller may also be configured to write data of first, second, and third binary bits to the first and second memory cells by programming each of the first and second memory cells to a respective one of the first, second, or third threshold voltages using the mapping of data.

The controller may be further configured to read the data of the first, second, and third binary bits from the first and second memory cells using only two different reference voltages that are applied to the first and second word lines. Moreover, the two different reference voltages may include a first reference voltage that is greater than the first threshold voltage and less than the second threshold voltage and a second reference voltage that is greater than the second threshold voltage and less than the third threshold voltage. In addition, the first memory cell may be one of a first plurality of memory cells connected in series, the second memory cell may be one of a second plurality of memory cells connected in series, the first plurality of memory cells may be connected to a first bit line, and the second plurality of memory cells may be connected to a second bit line. The memory cell array may also include a switch connected in series between the first and second bit lines, and the switch may be configured to electrically connect and disconnect the first and second bit lines.

The controller may include a first latch block coupled to the first bit line and a second latch block coupled to the second bit line. The first latch block may be configured to detect a state of the first memory cell during a read operation and to provide the state of the first memory cell directly to a data input/output circuit. The second latch block may be configured to detect a state of the second memory cell during the read operation and to provide the state of the second memory cell through the second bit line, through the switch, through the first bit line, and through the first latch block to the input/output circuit.

The controller may also be configured to program each of the first and second memory cells only to one of the first, second, or third threshold voltages during a write operation using the mapping of data.

According to some other embodiments of the present invention, a non-volatile semiconductor memory device may include a memory array, a page buffer, and a row decoder. The memory array may include first and second memory cells and first and second word lines respectively coupled to the first and second memory cells. The page buffer may be configured to map data of a set of first, second, and third bits to threshold voltage levels of the first and second memory cells. The row decoder may be configured to control the first and second word lines respectively applied to the first and second memory cells, to first and second reference voltages, with the first and second reference voltages having different voltage levels.

The memory array may further include a lower bit line connected to the first memory cell, an upper bit line connected to the second memory cell, and a switch connected in series between the lower bit line and the upper bit line. The switch may be configured to electrically connect and disconnect the lower bit line and the upper bit line. The page buffer may include a lower latch block electrically connected to the lower bit line and configured to provide data to a predetermined inner data line, and an upper latch block electrically connected to the upper bit line. Moreover, the first reference voltage may be lower than the second reference voltage. In addition, the non-volatile semiconductor memory device may be a NAND type memory device.

According to still other embodiments of the present invention, a method may be provided for driving a non-volatile semiconductor memory device with data of a set of first, second, and third bits being mapped to a pair of first and second memory cells. The method may include resetting lower latch data and upper latch data, and flipping the lower latch data using a threshold voltage of the first memory cell, which uses a first reference voltage as a reference. The upper latch data may be flipped using a threshold voltage of the second memory cell, which uses a second reference voltage as a reference. The threshold voltages of the first and second memory cells may be classified into first, second, and third threshold voltage groups based on the first reference voltage and the second reference voltage, and the second reference voltage may be higher than the first reference voltage. The lower latch data may then be flipped using the previously flipped upper latch data.

Flipping the latch data may include reflecting the threshold voltage of the first memory cell, which uses the first reference voltage as a reference, to the lower bit line, and reflecting the threshold voltage of the second memory cell, which uses the second reference voltage as a reference, to the upper bit line. The lower latch data may be flipped using a voltage level of the lower bit line resulting from reflecting the threshold voltage of the first memory cell, and the upper latch data may be flipped using a voltage level of the upper bit line resulting from reflecting the threshold voltage of the second memory cell.

Flipping the lower latch data using the previously flipped upper latch data may further include reflecting the previously flipped upper latch data to the lower bit line, and flipping the lower latch data using a voltage level of the lower bit line resulting from reflecting the upper latch data to the lower bit line. In addition, the flipped lower latch data may be recognized. Moreover, the non-volatile semiconductor memory device may be a NAND type memory device.

According to yet other embodiments of the present invention, a method of driving a non-volatile semiconductor memory device may include selecting a pair of first and second memory cells to which data of a set of first, second, and third bits are mapped. First and second word lines may be applied to the first and second memory cells, and the first and second word lines may be controlled to first and second reference voltages, and the first and second reference voltages may have different voltage levels.

According to some embodiments of the present invention, a non-volatile semiconductor memory-device may provide relatively high integration and relatively high reliability. According to other embodiments of the present invention, methods may be provided to efficiently drive non-volatile semiconductor memory devices.

According to some embodiments of the present invention, a non-volatile semiconductor memory device may include a memory array having a pair of first and second memory cells. A page buffer may be operated so as to map data of a set of first to third bits to threshold voltage levels of the set of first and second memory cells. A row decoder may control first and second word lines respectively, applied to the first and second memory cells, to first and second reference voltages, and the first and second reference voltages may have different voltage levels.

According to other embodiments of the present invention, methods may be provided to drive a non-volatile semiconductor memory device in which pieces of data of a set of first to third bits are mapped to a pair of first and second memory cells. Methods of driving a non-volatile semiconductor memory device according to some embodiments of the present invention may include resetting predetermined lower latch data and upper latch data. The lower latch data may be flipped using a threshold voltage of the first memory cell, which uses a first reference voltage as a reference, and the upper latch data may be flipped using a threshold voltage of the second memory cell, which uses a second reference voltage as a reference. The threshold voltages of the first and second memory cells may be classified into first to third threshold voltage groups based on the first reference voltage and the second reference voltage, which is higher than the first reference voltage. The lower latch data may be flipped using the previously flipped upper latch data.

According to still other embodiments of the present invention methods of driving a non-volatile semiconductor memory device may include selecting a pair of first and second memory cells to which data of a set of first to third bits are mapped. First and second word lines, applied to the set of first and second memory cells, may be controlled to first and second reference voltages, and the first and second reference voltages may have different voltage levels.

BRIEF DESCRIPTION OF THE DRAWINGS

FIG. 14 is a diagram illustrating voltage levels of first and second word lines applied to first and second memory cells in a first page read of FIG. 12.

DETAILED DESCRIPTION

Figure 1:
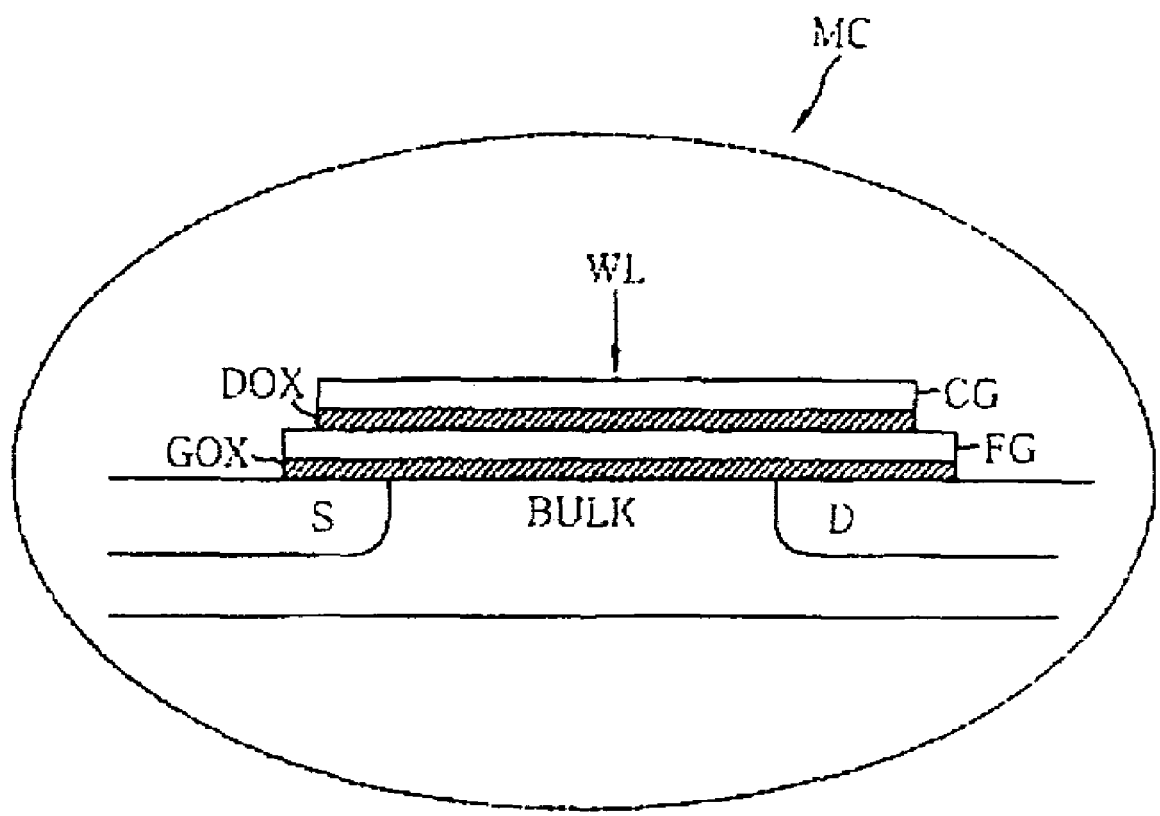
FIG. 1 is a cross sectional view illustrating a conventional transistor-type memory cell.
Figure 2:
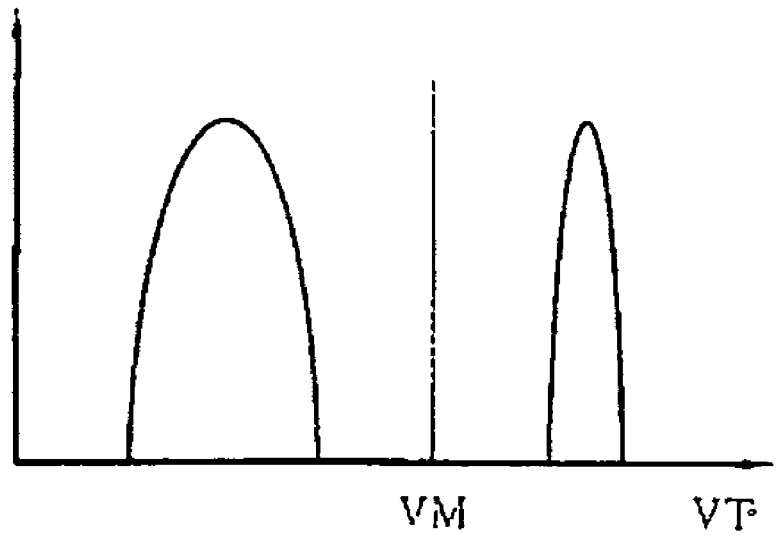
FIG. 2 is a diagram illustrating a threshold voltage distribution of a conventional 2-level memory cell.
Figure 3:
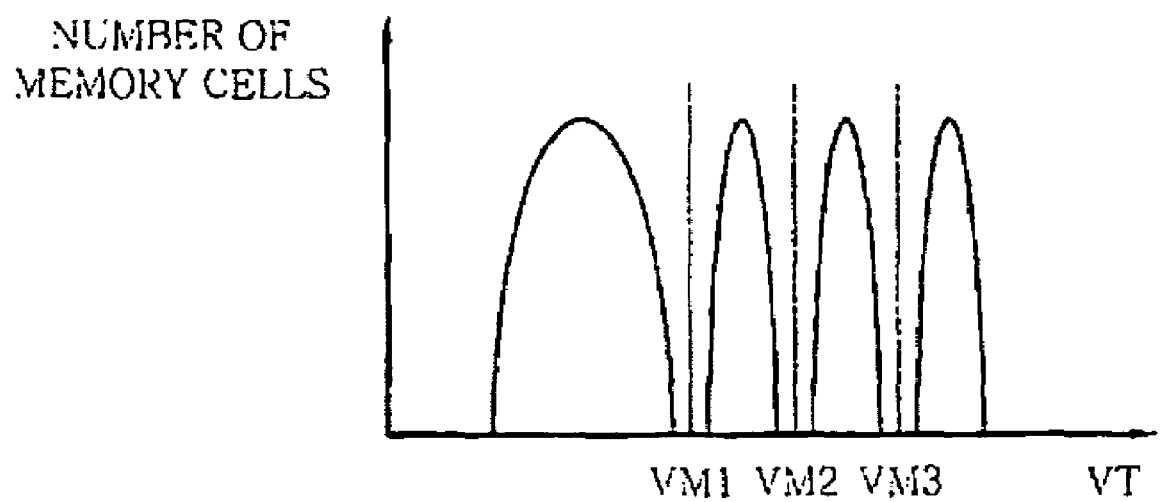
FIG. 3 is a diagram illustrating a threshold voltage distribution of a conventional 4-level memory cell.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
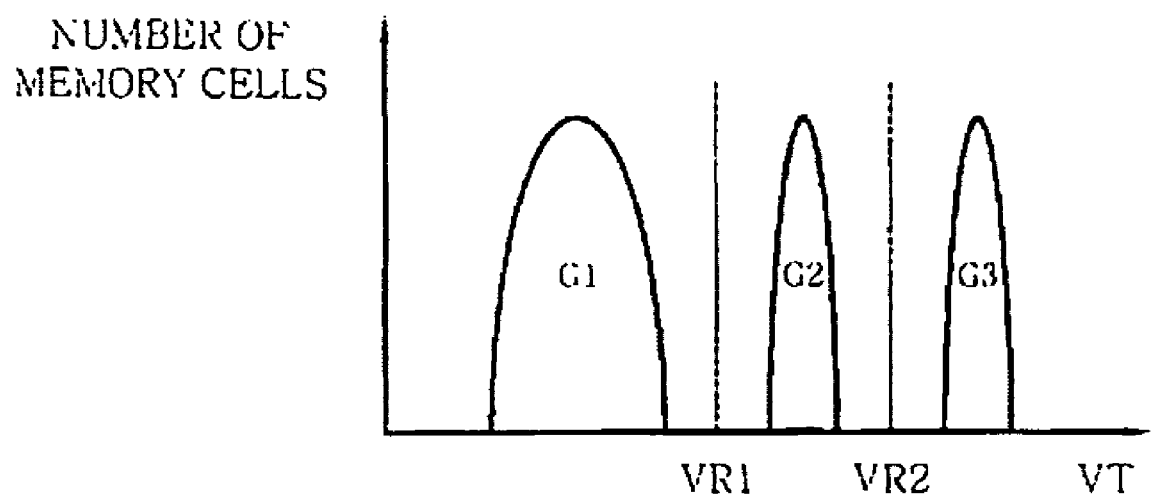
FIG. 4 is a diagram illustrating a threshold voltage distribution of a 3-level memory cell.

A non-volatile semiconductor memory device according to embodiments of the present invention may include 3-level memory cells. A 3-level memory cell MC can be programmed to one of 3 threshold voltage level groups, as illustrated in FIG. 4. The threshold voltage groups of the memory cells can be distinguished using a first reference voltage VR1 and a second reference voltage VR2. In this specification, the threshold voltage group that is lower than the first reference voltage VR1 is referred to as "a first threshold voltage group G1", the threshold voltage group that is between the first reference voltage VR1 and the second reference voltage VR2 is referred to as "a second threshold voltage group G2", and the threshold voltage group that is higher than the second reference voltage VR2 is referred to as "a third threshold voltage group G3".

As described above, 3-level memory cells may provide a relatively high degree of integration by providing a larger number of data storage states than is provided by 2-level memory cells. Furthermore, 3-level memory cells may provide relatively high reliability because spaces between threshold voltage-levels may be increased relative to 4-level memory cells. A non-volatile semiconductor memory device including 3-level memory cells (here, referred to as a '3-level non-volatile semiconductor memory device') may provide significant advantages in terms of integration and reliability.

Figure 5:
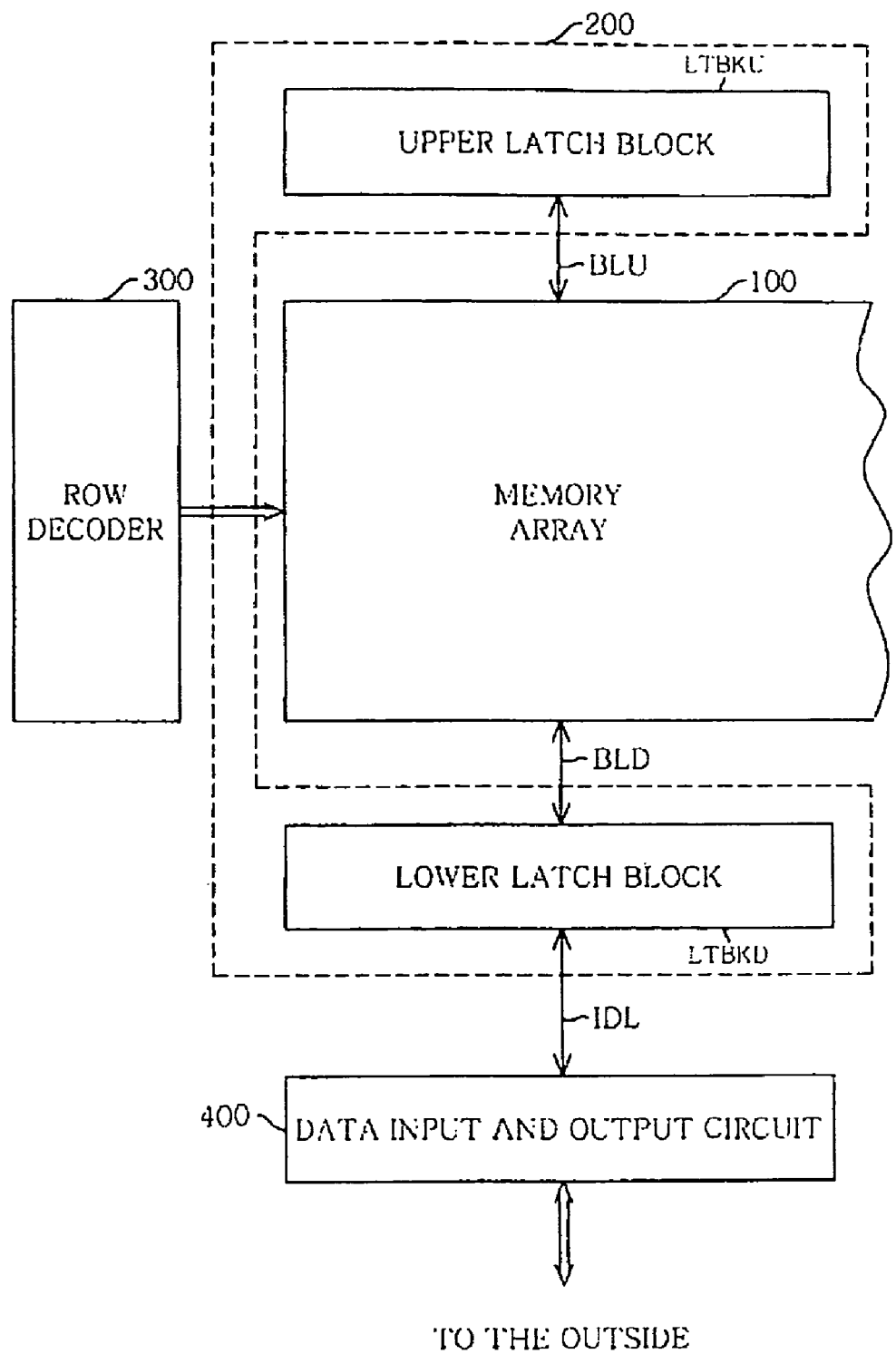
FIG. 5 is a block diagram illustrating portions of a semiconductor memory device according embodiments of the present invention.

FIG. 5 is a diagram illustrating portions of a semiconductor memory device according to some embodiments of the present invention. In FIG. 5, a memory array 100, a page buffer 200, a row decoder 300, and a data input and output circuit 400 are illustrated. A controller of the memory device may be defined, for example, to include the page buffer 200, the row decoder 200, and/or the data input and output circuit 400.

Figure 6:
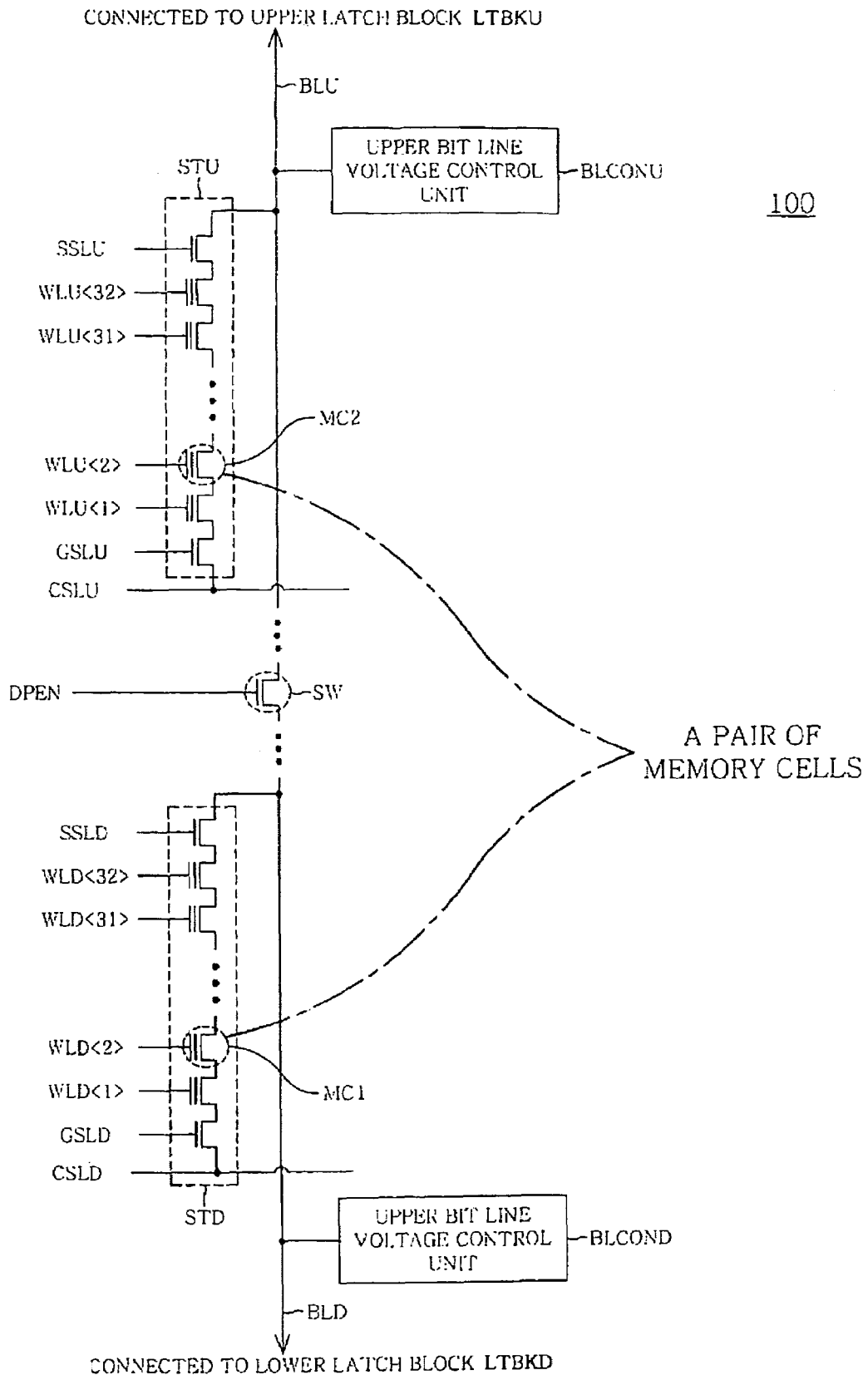
FIG. 6 is a circuit diagram illustrating portions of the memory array of FIG. 5 in a NAND-type non-volatile semiconductor memory device according to embodiments of the present invention.

The memory array 100 includes a plurality of memory cells arranged in a matrix including columns and rows. FIG. 6 is a diagram illustrating portions of the memory array 100 of FIG. 5 for a NAND-type non-volatile semiconductor memory device.

The memory array 100 may include a lower bit line BLD and an upper bit line BLU, which are selected using the same Y-address, as illustrated in FIG. 6. The lower bit line BLD and the upper bit line BLU are electrically connected to each other through a switch SW. That is, when a dumping enable signal DPEN is activated to "H", the lower bit line BLD and the upper bit line BLU may be electrically connected to each other.

The lower bit line BLD and the upper bit line BLU may be controlled to a power supply voltage VDD and a ground voltage VSS respectively using a lower bit line control unit BLCOND and an upper bit line control unit BLCONU at the time of the program and read operations of the non-volatile semiconductor memory device according to embodiments of the present invention.

A plurality of memory cells may be included in each of a lower string STD connected to the lower bit line BLD and an upper string STU connected to the upper bit line BLU. In this specification, memory cells included in the lower string STD may be referred to as 'first memory cells MC1', and memory cells included in the upper string STU may be referred to as 'second memory cells MC2'.

Each of the first memory cells MC1s and the second memory cells MC2s can be implemented using a same type of memory cells, can perform electrical program and erase operations, and can preserve data even when power is interrupted.

According to some embodiments of the present invention, a first memory cell MC1 and a second memory cell MC2, which constitute a pair, may be respectively arranged in the lower string STD and the upper string STU, and may be selected using the same Y-address. More, particularly, one first memory cell MC1, included in the lower string STD, and one second memory cell MC2, included in the upper string STD, constitute a set.

First to third bits of data (which constitute a set) can be programmed in a pair of first and second memory cells MC1 and MC2. Furthermore, storage states based on the threshold voltages of the set of 2 memory cells may be read as first to third data values. In this specification and drawings, the first to third bits are designated by reference characters 'BIT1~BIT3'.

Referring to FIG. 5 again, the page buffer 200 includes a lower latch block LTBKD and an upper latch block LTBKU. The lower latch block LTBKD is electrically connected to the lower bit line BLD, and provides data to a predetermined internal data line IDL. The upper latch block LTBKU is electrically connected to the upper bit line BLU.

The page buffer 200 is thus coupled to the memory array 100 through the lower and upper bit lines BLD and BLU. Furthermore, the page buffer 200 operates to map the data of the set of first to third bits BIT1 to BIT3 to the threshold voltage group of the set of first and second memory cells MC1 and MC2.

Figure 7:
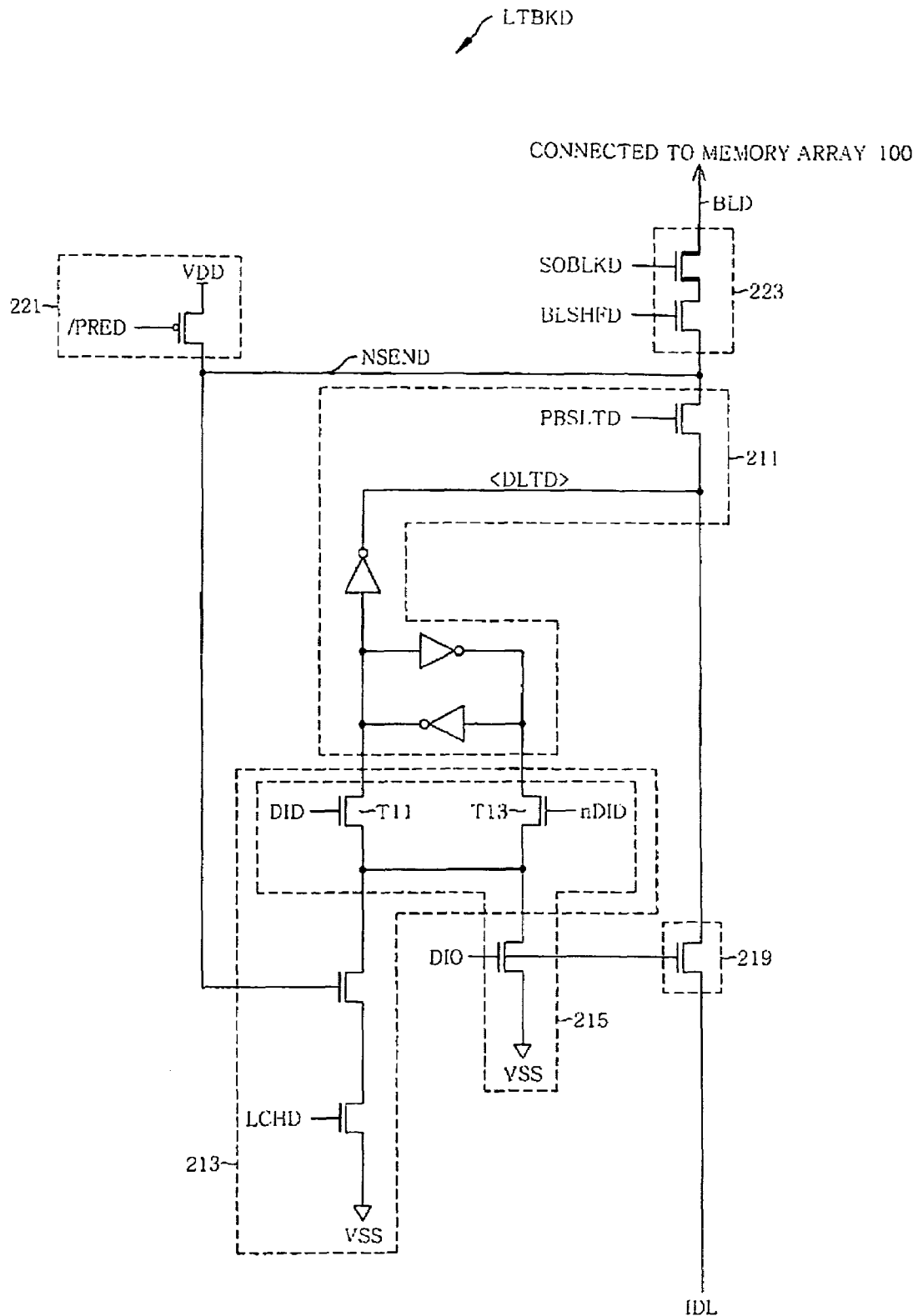
FIG. 7 is a circuit diagram illustrating the lower latch block of FIG. 5 according to some embodiments of the present invention.

FIG. 7 is a diagram illustrating the lower latch block LTBKD of FIG. 5. The lower latch block LTBKD can store lower latch data DLTD, and is connected to the lower bit line BLD. The lower latch block LTBKD includes a lower sensing terminal NSEND, a lower latch unit 211, a lower flip unit 213, and a lower latch control unit 215.

The lower sensing terminal NSEND is connected to the lower bit line BLD in response to a lower bit line connection signal BLSHFD and a lower bit line selection signal SOBLKD. At this time, the data of the lower sensing terminal NSEND can be provided to the lower bit line BLD through the lower bit line connection unit 223.

The lower latch unit 211 latches and stores lower latch data DLTD. Furthermore, the lower latch unit 211 can transmit the lower latch data DLTD to the lower bit line BLD in response to a lower buffer selection signal PBSLTD.

The lower flip unit 213 flips the lower latch data DLTD from logic "L" to logic "H" depending on the voltage level of the lower sensing terminal NSEND. In this case, the lower input signal DID is activated to "H". Furthermore, the lower flip unit 213 inversely flips the lower latch data DLTD from logic "H" to logic "L" depending on the voltage level of the lower sensing terminal NSEND. In this case, the lower inverted input signal nDID is activated to "H".

The lower latch control unit 215 sets the lower latch data DLTD to "H". In this case, the lower input signal DID is activated to "H". Furthermore, the lower latch control unit 215 resets the lower latch data DLTD to "L". At this time, the lower inverted input signal nDID is activated to "H".

In FIG. 7, an NMOS transistor T11, which is gated to the lower input signal DID, and an NMOS transistor T13, which is gated to the lower inverted input signal nDID, are included in both of the lower flip unit 213 and the lower latch control unit 215.

The lower latch block LTBKD may further include an output unit 219, a lower pre-charge unit 221, and a lower bit line connection unit 223. The output unit 219 may provide the lower latch data DLTD of the lower latch unit 211 to an inner data line IDL in response to an output control signal DIO. The lower pre-charge unit 221 may pre-charge the lower sensing terminal NSEND to a power supply voltage VDD in response to a lower sensing pre-charge signal /PRED. The lower bit line connection unit 223 may control the electric connection between the lower bit line BLD and the lower sensing terminal NSEND in response to the lower bit line connection signal BLSHFD and the lower bit line selection signal SOBLKD.

Figure 8:
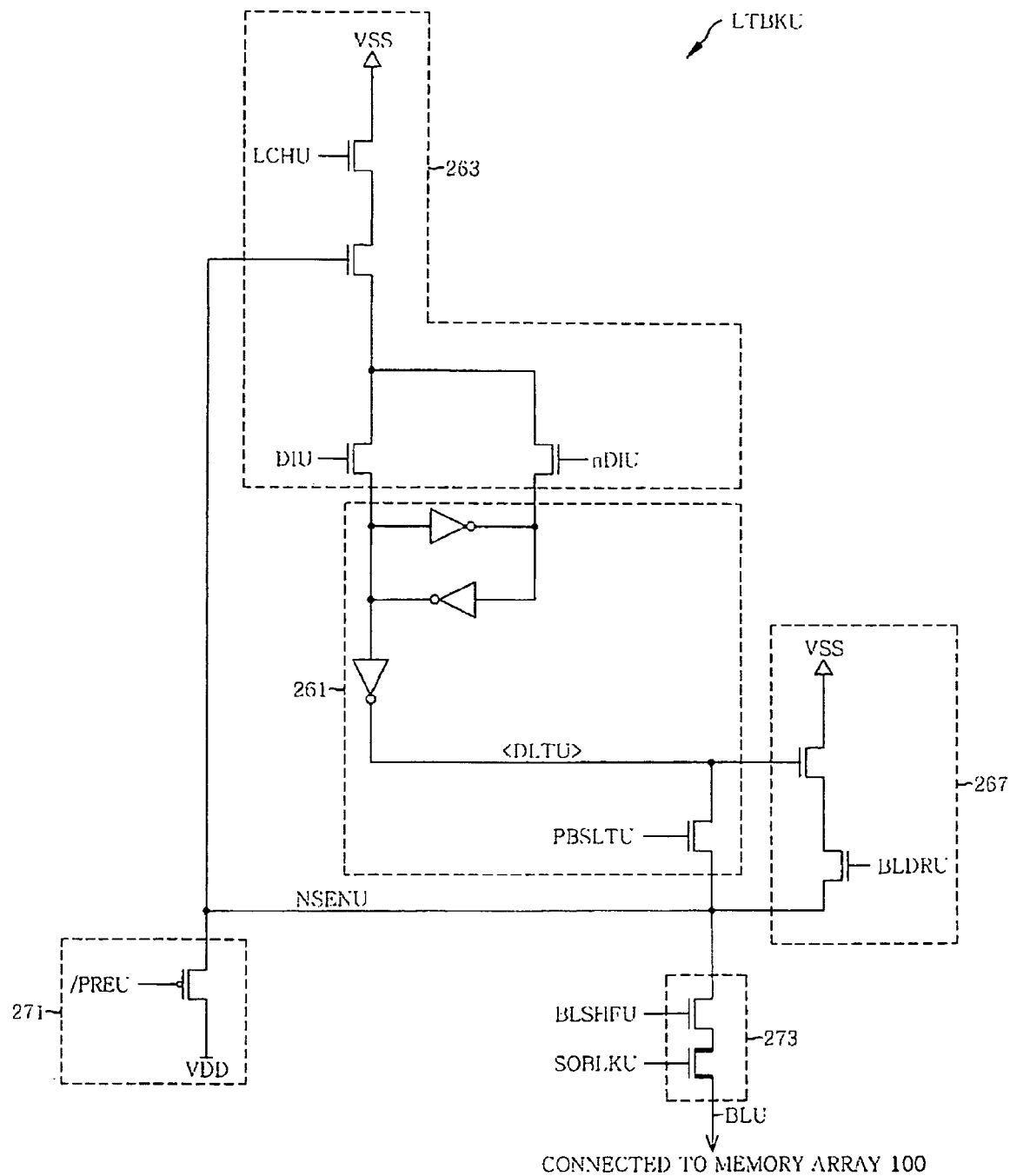
FIG. 8 is a circuit diagram illustrating the upper latch block of FIG. 5 according to some embodiments of the present invention.

FIG. 8 is a circuit diagram illustrating the upper latch block LTBKU of FIG. 5. The upper latch block LTBKU can store upper latch data DLTU, and is connected to the upper bit line BLU. The upper latch block LTBKU includes an upper sensing terminal NSENU, an upper latch unit 261, an upper flip unit 263, and a dumping unit 267.

The upper sensing terminal NSENU may be connected to the upper bit line BLU in response to an upper bit line connection signal BLSHFU and an upper bit line connection signal SOBLKU. In this case, the data of the upper sensing terminal NSENU can be provided to the upper bit line BLU through the upper bit line connection unit 273.

The upper latch unit 261 flips the upper latch data DLTU from logic "L" to logic "H" depending on the voltage level of the upper sensing terminal NSENU. In this case, an upper input signal DIU is activated to "H". Furthermore, the upper flip unit 263 inversely flips the upper latch data DLTU from logic "H" to logic "L" depending on the voltage level of the upper sensing terminal NSENU. In this case, an upper inverted input signal nDIU is activated to "H".

The upper flip unit 263 sets the upper latch data DLTU to "H" with the upper input signal DIU activated to "H". Furthermore, the upper flip unit 263 resets the upper latch data DLTU to "L" with the upper inverted input signal nDIU activated to "H".

The dumping unit 267 discharges the upper sensing terminal NSENU to a ground voltage VSS based on the upper latch data DLTU. Particularly, the dumping unit 267 discharges the upper sensing terminal NSENU to the ground voltage VSS in response to a bit line driving signal BLDRV when the upper latch data DLTU is at logic "H". The dumping unit 267 functions to invert the upper latch data DLTU, which is at logic "H", and provide it to the upper sensing terminal NSENU.

The upper latch block LTBKU may further include an upper pre-charge unit 271 and an upper bit line connection unit 273. The upper pre-charge unit 271 pre-charges the upper sensing terminal NSENU to a power supply voltage VDD in response to an upper sensing pre-charge signal /PREU. The bit line connection unit 273 controls an electric connection between the upper bit line BLU and the upper sensing terminal NSENU in response to an upper bit line connection signal BLSHFU and an upper bit line selection signal SOBLKU.

Referring again to FIG. 5, the row decoder 300 is coupled to the memory array 100. The row decoder 300 controls the voltage level of a selected word line WL, and generates a string selection signal SSL and a ground selection signal GSL. The row decoder 300 can control first and second word lines (in this example, WLD<2> and WLU<2>; see FIG. 6), applied respectively to the set of first and second memory cells MC1 and MC2, to first and second reference voltages VR1 and VR2.

The data input and output circuit 400 outputs data latched in the page buffer 200 to an external system, and, loads data input from the external system to the page buffer 200.

The data value of the inner data line IDL may have a phase opposite that of the first to third bits BIT1 to BIT3 of data which are provided to the outside. That is, if each bit of data is "1", the inner data line IDL is "L", and, if each bit of data is "0", the inner data line IDL is "H".

Methods of programming the non-volatile semiconductor memory device according to some embodiments of the present invention will now be described. The programming of a pair of memory cells may be performed in the order of first to third page program operations respectively using the first to third bits BIT1 to BIT3, as illustrated in FIG. 9.

Figure 9:
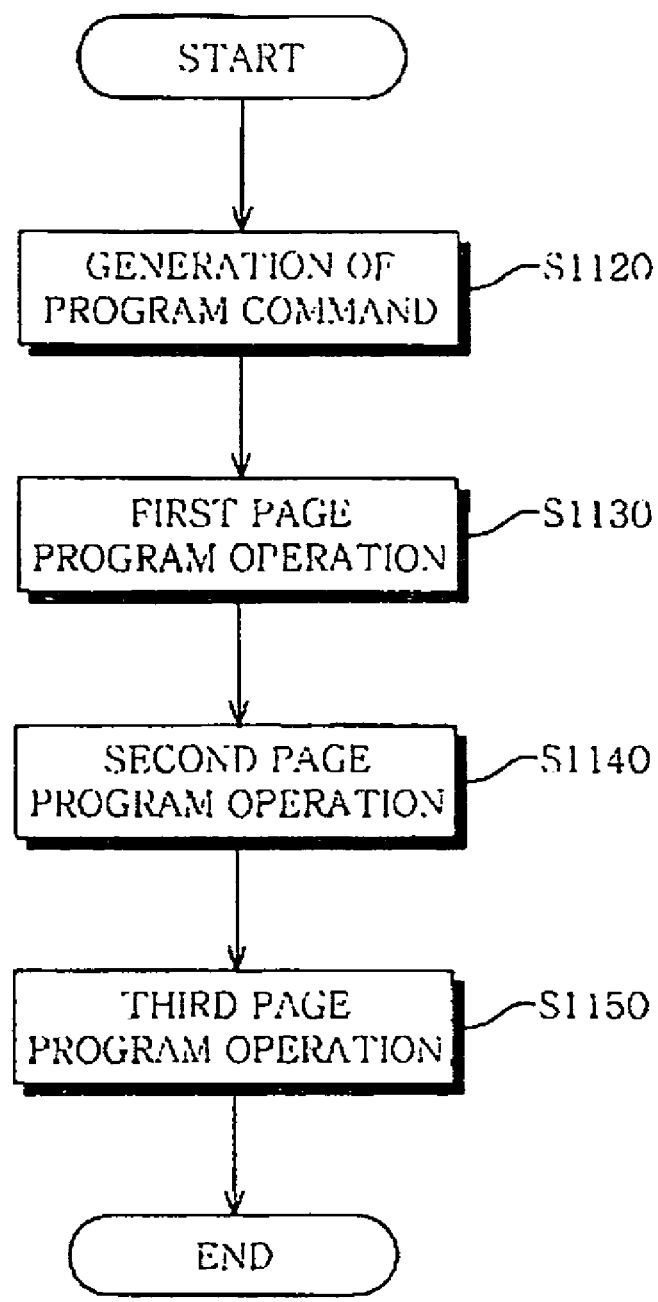
FIG. 9 is a flow chart illustrating operations of driving a non-volatile semiconductor memory device according to some embodiments of the present invention.

FIG. 9 is a flow chart illustrating operations of driving a non-volatile semiconductor memory device according to some embodiments of the present invention to provide data programming. First, a program command CMD used to direct a program operation is input at block S1120. At block S1130, a first page program operation is performed. The threshold voltage of a first memory cell MC1 is programmed with a second threshold voltage group G2 according to the data of a first bit BIT1 at block S1130 (see STEP1 of FIG. 10).

At block S1140, a second page program operation is performed. The threshold voltage of a second memory cell MC2 is programmed with a second threshold voltage group G2 according to the data of a second bit BIT2 at block S1140 (see STEP2 of FIG. 10).

At block S1150, a third page program operation is performed. The threshold voltage of the first memory cell MC1 and/or the second memory cell MC2 is programmed with a third threshold voltage group G3 according to the data of a third bit BIT3 at block S1150 (see STEP3 of FIG. 10).

Figure 10:
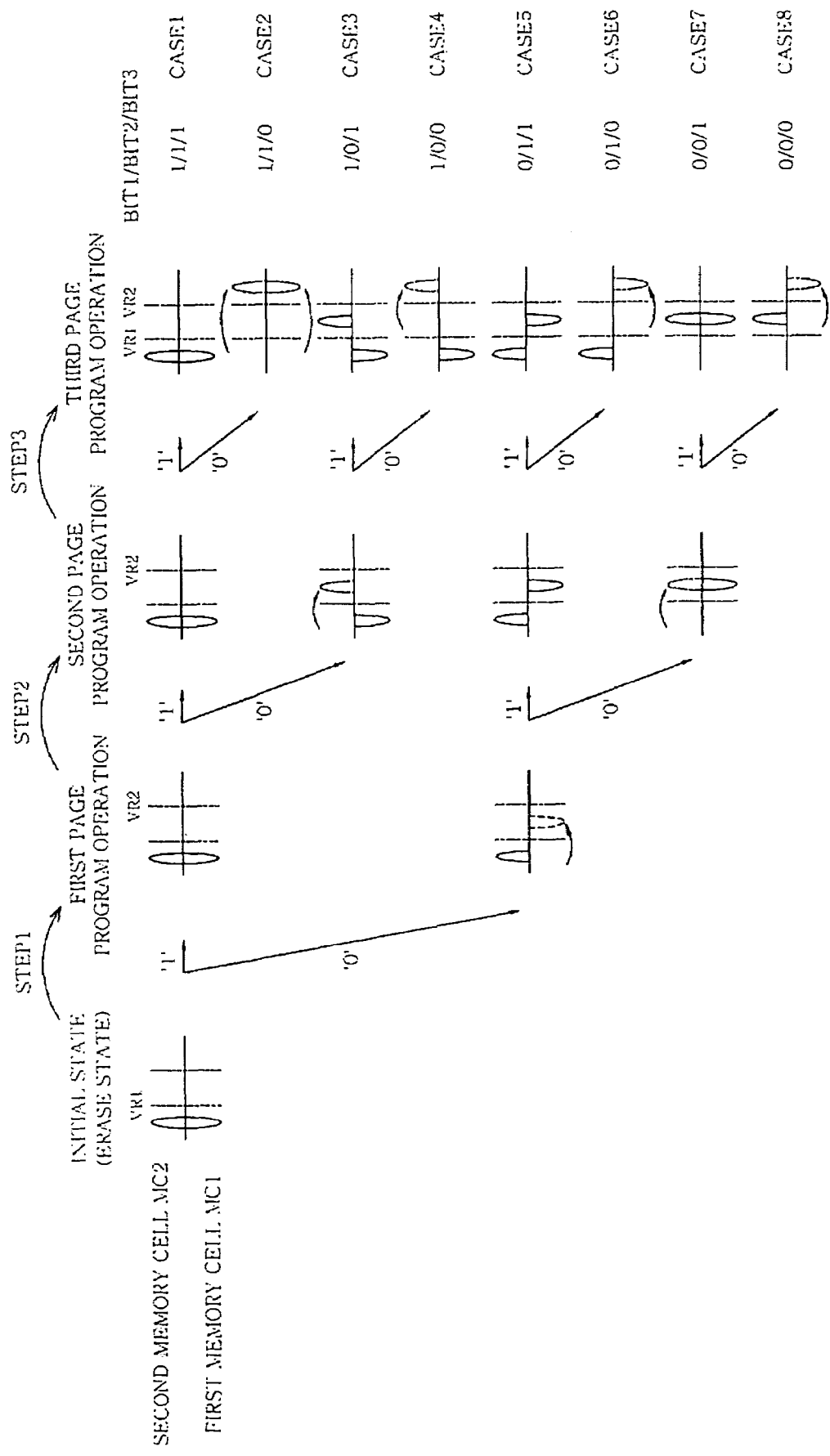
FIG. 10 is a diagram illustrating variations in threshold voltages of first and second memory cells when driving the non-volatile semiconductor memory devices according to operations of FIG. 9.

Referring to FIG. 10, the threshold voltages of the first and second memory cells MC1 and MC2 after the performance of the third page programming are as follows. In a case CASE1 where the data of first, second and third bits BIT1, BIT2 and BIT3 are all "1" according to some embodiments of the present invention, the threshold voltages of the first and second memory cells MC1 and MC2 are all in an erase state, that is, the first threshold voltage group G1.

In a case CASE2 where the data of the first and second bits BIT1 and BIT2 are "1" and the data of a third bit BIT3 is "0" according to some embodiments of the present invention, the threshold voltages of the first and second memory cells MC1 and MC2 are all in the third threshold voltage group G3.

In a case CASE3 where the data of the first bit BIT1 is "1", the data of the second bit BIT2 is "0", and the data of the third bit BIT3 is "1" according to some embodiments of the present invention, the threshold voltage of the first memory cell MC1 is set at the first threshold voltage group G1, and the threshold voltage of the second memory cell MC2 is set at the second threshold voltage group G2.

In a case CASE4 where the data of the first bit BIT1 is "1", the data of the second bit BIT2 is "0", and the data of the third bit BIT3 is "0" according to some embodiments of the present invention, the threshold voltage of the first memory cell MC1 is set at the first threshold voltage group G1, and the threshold voltage of the second memory cell MC2 is set at the third threshold voltage group G3.

In a case CASE5 where the data of the first bit BIT1 is "0", the data of the second bit BIT2 is "1", and the data of the third bit BIT3 is "1" according to some embodiments of the present invention, the threshold voltage of the first memory cell MC1 is set at the second threshold voltage group G2, and the threshold voltage of the second memory cell MC2 is set at the first threshold voltage group G1.

In a case CASE6 where the data of the first bit BIT1 is "0", the data of the second bit BIT2 is "1", and the data of the third bit BIT3 is "0" according to some embodiments of the present invention, the threshold voltage of the first memory cell MC1 is set at the third threshold voltage group G3, and the threshold voltage of the second memory cell MC2 is set at the first threshold voltage group G1.

In a case CASE7 where the data of the first bit BIT1 is "0", the data of the second bit BIT2 is "0", and the data of the third bit BIT3 is "1" according to some embodiments of the present invention, the threshold voltages of the first and second memory cells MC1 and MC are both set at the second threshold voltage group G2.

In a case CASE8 where the data of the first, second and third bits BIT1, BIT2 and BIT3 are all "0" according to some embodiments of the present invention, the threshold voltage of the first memory cell MC1 is set at the third threshold voltage group G3, and the threshold voltage of the second memory cell MC2 is set at the second threshold voltage group G2.

Methods of reading non-voluble semiconductor memory devices according to some embodiments of the present invention will be described. Although the first to third page reading operations (where the first to third bits BIT1 to BIT3 are read) may be randomly performed, a pair of memory cells can be read.

Figure 11:
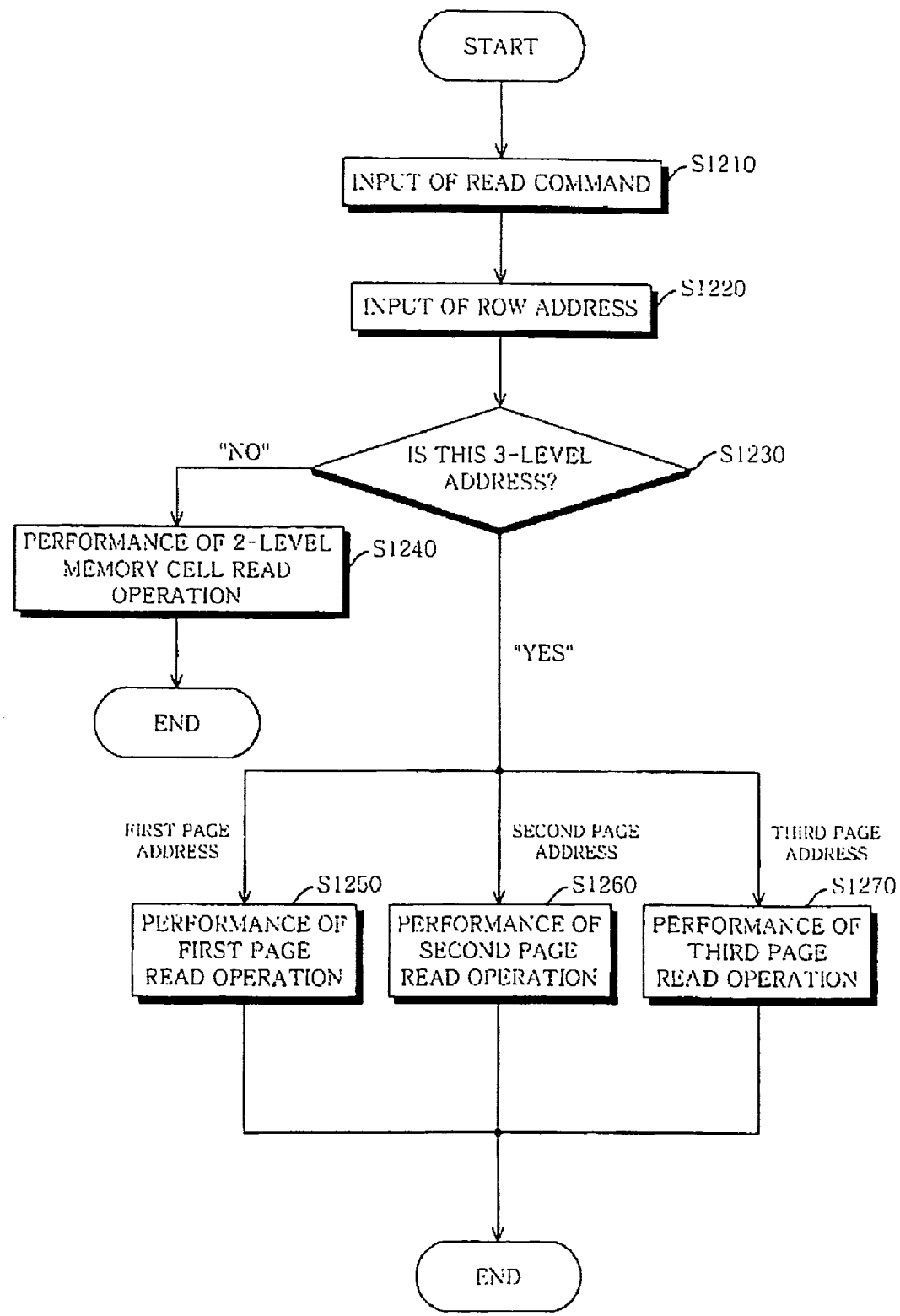
FIG. 11 is a flow chart illustrating operations of driving a non-volatile semiconductor memory device according to embodiments of the present invention.

FIG. 11 is a flow chart illustrating operations of driving a non-volatile semiconductor memory device according to some embodiments of the present invention for data read operations. Referring to FIG. 11, an operation command CMD used to direct a read operation is input at block S1210, and a row address is input at block S1220.

At block S1230, whether the input row address is a 3-level address used to select a pair of first and second memory cells MC1 and MC2 is determined. If it is determined that the input row address is not a 3-level address, a read operation for a conventional 2-level memory cell may be performed at block S1240. If it is determined that the input row address is a 3-level address, an operation of reading a corresponding page is performed at blocks S1250, S1260 and S1270.

Figure 12:
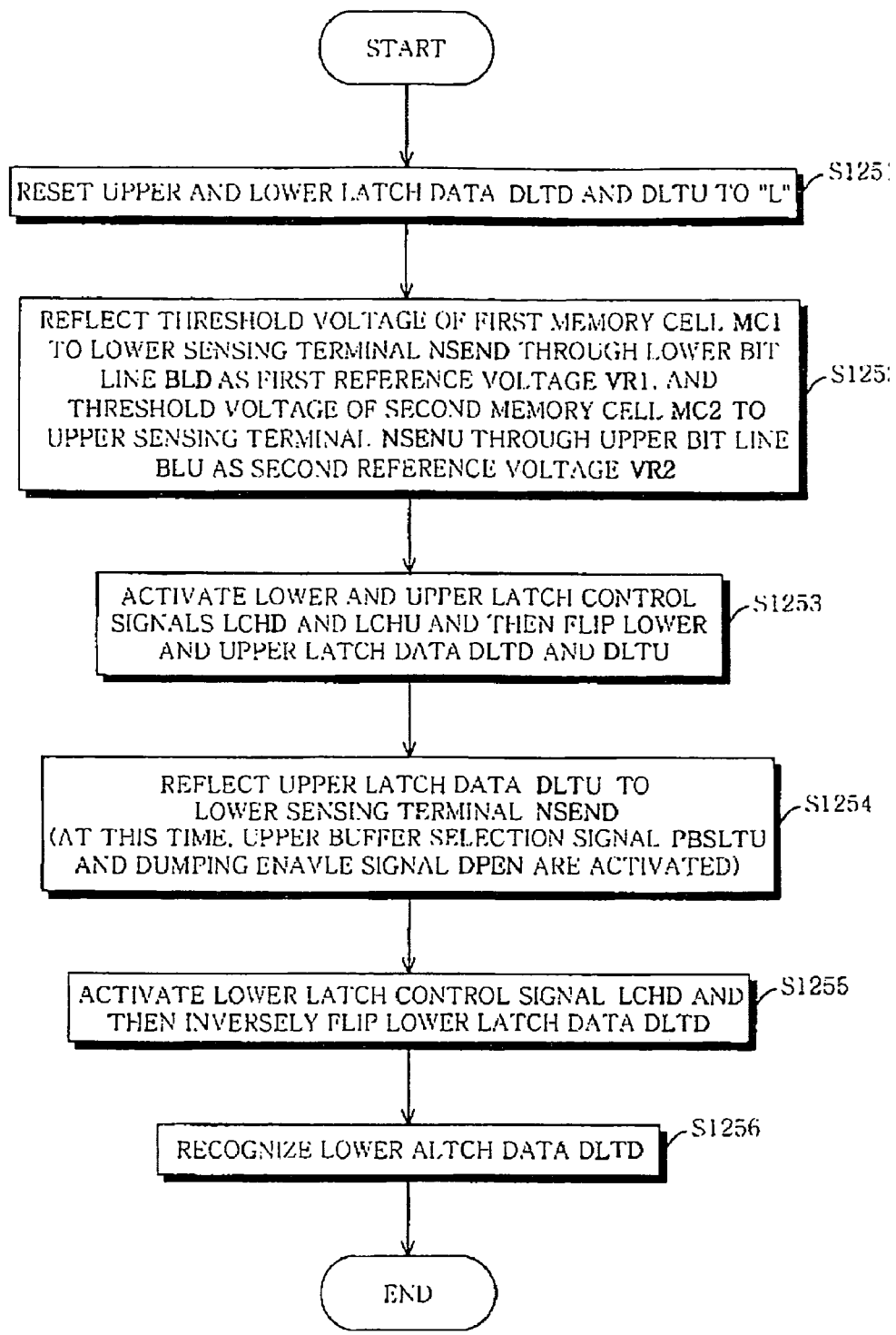
FIG. 12 is a flow chart illustrating operations of the first page read of FIG. 11.
Figure 13:
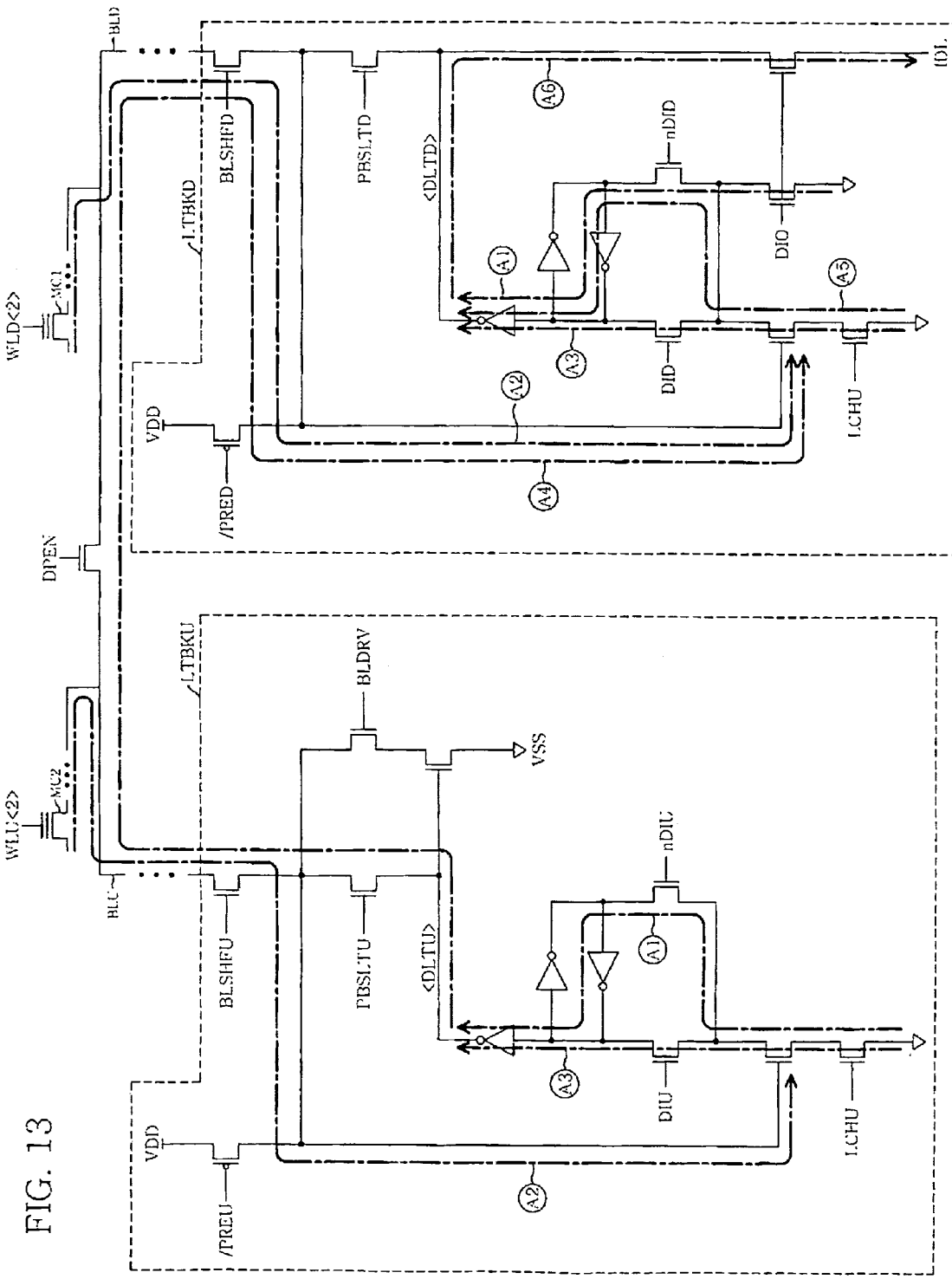
FIG. 13 is a circuit diagram illustrating a data flow of the flowchart of FIG. 12.

FIG. 12 is a flowchart illustrating operations of the first page read of black S1250 of FIG. 11, and FIG. 13 is a circuit diagram illustrating the data flow of the flowchart of FIG. 12.

Referring to FIG. 10 again, the first bit data BIT1 is mapped to the threshold voltage of the first memory cell MC1, which uses the first reference voltage VR1 as a reference, or the threshold voltage of the second memory cell MC2, which uses the second reference voltage VR2 as a reference. That is, when the first bit BIT1 is "1", the threshold voltage of the first memory cell MC1 is lower than the first reference voltage VR1, or the threshold voltage of the second memory cell MC2 is higher than the second reference voltage VR2.

As a result, the data of the first bit BT1 can be read by checking the threshold voltage of the first memory cell MC1, which uses the first reference voltage VR1 as a reference, and by checking the threshold voltage of the second memory cell MC2, which uses the second reference voltage VR2 as a reference.

Referring to FIG. 12, upper and lower latch data DLTD and DLTU are reset to logic "L" at block S1251 (see (A1) of FIG. 13). At this time, the lower and upper inverse-input signals nDID and nDIU are activated to "H".

At blocks S1252 and S1253, the lower latch data DLTD is flipped using the threshold voltage of the first memory cell MC1, which uses the first reference voltage VR1 as a reference, and the upper latch data DLTU is flipped using the threshold voltage of the second memory cell MC2, which uses the second reference voltage VR2 as a reference In detail, at block S1252, the threshold voltage of the first memory cell MC1 is reflected to the lower sensing terminal NSEND through the lower bit line BLD as the first reference voltage VR1, and the threshold voltage of the second memory cell MC2 is reflected to the upper sensing terminal NSENU through the upper bit line BLU as the second reference voltage VR2 (see (A2) of FIG. 13).

In other words, as illustrated in FIG. 14, the first word line WLD<2> applied to the first memory cell MC1 is controlled to the first reference voltage VR1, and the second word line WLU<2> applied to the second memory cell MC2 is controlled to the second reference voltage VR2. Furthermore, the remaining word lines are controlled to a pass voltage VPASS. The pass voltage VPASS is a voltage level capable of allowing turn-on regardless of the threshold voltage of a corresponding memory cell.

At block S1253, lower and upper latch control signals LCHD and LCHU are generated in the form of "H" pulses and the lower and upper input signals DID and DIU are activated to "H". At this time, the lower and upper latch data DLTD and DLTU are flipped from "L" to "H" depending on the voltage levels of the lower and upper sensing terminals NSEND and NSENU, that is, the voltage levels of the lower and upper bit lines BLD and BLU (see (A3) of FIG. 13).

As a result, in the cases CASE1, CASE3 and CASE4 of FIG. 10, the lower latch data DLTD is maintained at "L", and, in the cases CASE2, CASE5 and CASE8, the lower latch data DLTD is flipped to "H". Furthermore, in the cases CASE2 and CASE4, the upper latch data DLTU is flipped to "H", and, in the cases CASE1, CASE3 and CASE5 to CASE8, the upper latch data DLTU is maintained at "L".

Furthermore, at blocks S1254 and S1255, the lower latch data DLTD is flipped using the upper latch data DLTU, which was flipped at block S1253.

In detail, at block S1254, the upper latch data DLTU is reflected to the lower sensing terminal NSEND. At this time, an upper buffer selection signal PBSLTU and a dumping enable signal DPEN are activated to "H" (see (A4) of FIG. 13).

Furthermore, at block S1255, the lower latch control signal LCHD is activated to "H", so that the lower latch data DLTD is inversely flipped from "H" to "L" depending on the voltage level of the lower sensing terminal NSEND, that is, the voltage level of the lower bit line BLD (see (A5) of FIG. 13). At this time, the lower inverse-input signal nDID is activated. As a result, the lower latch data DLTD is inversely flipped from "H" to "L" only in the case CASE2 of FIG. 10.

As a result of performance of block S1255, in the cases CASE1 to CASE4 of FIG. 10, the lower latch data DLTD is "L", and, in the cases CASE5 to CASE8, the lower latch data DLTD is "H".

Furthermore, in the cases CASE2 and CASE4 of FIG. 10, the upper latch data DLTU is flipped to "H", and, in the cases CASE1, CASE3, and CASE5 to CASE8, the upper latch data DLTD is maintained at "H".

At block S1256, the output control signal DIO is generated in the form of "H" pulses, so that the logic state of the lower latch data DLTD is output to the inner data line IDL (see (A6) of FIG. 13).

In some embodiments, output data having logic "L" indicates that the data of the first bit BIT1 is "1", and output data having logic "H" indicates that the data of the first bit BIT1 is "1", As described above, according to methods of driving non-volatile semiconductor memory devices according to embodiments of the present invention, the data value of the first bit BIT1 can be recognized by simultaneously sensing threshold voltages of the first and second memory cells once and performing a reading operation once.

Referring to FIG. 10 again, the data of the second bit BIT2 is "1" in the case of a specific combination, that is, the case CASE2 in which the first to third bit BIT1 to BIT3 are respectively 1, 1, and 0. Furthermore, the data of the second bit BIT2 is mapped to the threshold voltage of the second memory cell MC2 which uses the first reference voltage VR1 as a reference, except for a specified combination (for example, CASE2).

Accordingly, the second bit BIT2 may be recognized as the data value of "0" in the cases CASE2, CASE3, CASE4, CASE7, CASE8, where the threshold voltage of the second memory cell MC2 is higher than the first reference voltage VR1, except for the specific combination CASE2, that is, the case where the threshold voltages of the first and second memory cells MC1 and MC2 are higher than the second reference voltage VR2.

Furthermore, the data of the third bit BIT3 may be mapped to the threshold voltages of the first and second memory cells MC1 and MC2, which use the second reference voltage VR2 as a reference. That is, when the third bit BIT3 is "1", the threshold voltages of the first memory cell MC1 and the second memory cell MC2 may be lower than the second reference voltage VR2. When the third bit BIT3 is "0", the threshold voltage of the first memory cell MC1 and/or the second memory cell MC2 may be higher than the second reference voltage VR2.

As a result, with respect to the third bit BIT3, the data value of "0" can be recognized when the threshold voltage of the first memory cell MC1 is higher than the second reference voltage VR2 (CASE2, CASE6, and CASE8 of FIG. 10), or the threshold voltage of the second memory cell MC2 is higher than the second reference voltage VR2 (CASE2 and CASE4 of FIG. 10).

As described above, a non-volatile semiconductor memory device according to some embodiments of the present invention may include memory cells which can be controlled within 3 threshold voltage levels and a page buffer that controls the memory cells. Non-volatile semiconductor memory devices according to some embodiments of the present invention may provide higher integration than 2-level non-volatile semiconductor memory devices. Furthermore, non-volatile semiconductor memory devices according to some embodiments of the present invention may provide higher reliability than 4-level non-volatile semiconductor memory devices.

In non-volatile semiconductor memory devices and driving methods according to some embodiments of the present invention, word lines of the first and second memory cells may be controlled to respective first and second reference voltages. Therefore, according to non-volatile semiconductor memory devices and driving methods of some embodiments of the present invention, a data value of a first bit can be recognized by simultaneously sensing the threshold voltages of the first and second memory cells once and performing a reading operation once. Accordingly, a speed of a read operation to read data of the first bit in the non-volatile semiconductor memory device may be increased.

Although embodiments of the present invention have been disclosed for illustrative purposes, those skilled in the art will appreciate that various modifications, additions and substitutions are possible, without departing from the scope and spirit of the invention as set forth in the accompanying claims.

What is claimed is:

1. A non-volatile semiconductor memory device, comprising:
a memory array including first and second memory cells and first and second word lines respectively coupled to the first and second memory cells wherein the first and second word lines are different word lines;

a page buffer configured to map data of a set of first, second, and third bits to threshold voltage levels of the first and second memory cells during a write operation;

a row decoder configured to control the first word line and the second word line respectively applied to the first memory cell and the second memory cell during a read operation, to respectively apply a first reference voltage and a second reference voltage to the first memory cell and the second memory cell simultaneously during the read operation, the first reference voltage and the second reference voltage having different voltage levels wherein the first reference voltage is lower than the second reference voltage;

a first bit line connected to the first memory cell; and a second bit line connected to the second memory cell.

2. The non-volatile semiconductor memory device of claim 1, wherein the memory array further includes:

a switch connected in series between the first bit line and the second bit line, wherein the switch is configured to electrically connect and disconnect the first bit line and the second bit line.

3. The non-volatile semiconductor memory device of claim 2, wherein the page buffer comprises:

a first latch block electrically connected to the first bit line and configured to provide data to a predetermined inner data line; and a second latch block electrically connected to the second bit line.

4. The non-volatile semiconductor memory device of claim 1, wherein the non-volatile semiconductor memory device is a NAND type memory device.

5. A method of driving a non-volatile semiconductor memory device wherein data of a set of first, second, and third bits are mapped to a pair of first and second memory cells, first and second word lines respectively coupled to the first and second memory cells, the method comprising:

A) resetting lower latch data of a lower latch and upper latch data of an upper latch wherein the lower and upper latches are different latches;

B) flipping the lower latch data of the lower latch using a threshold voltage of the first memory cell, which uses a first reference voltage applied to the first word line as a reference, and flipping the upper latch data of the upper latch using a threshold voltage of the second memory cell, which uses a second reference voltage applied to the second word line as a reference, the threshold voltages of the first and second memory cells being classified into first, second, and third threshold voltage groups based on the first reference voltage and the second reference voltage, wherein the second reference voltage is higher than the first reference voltage; and C) flipping the lower latch data of the lower latch using the previously flipped upper latch data of the upper latch.

6. The method of claim 5, wherein the step B) further comprises:

B1) reflecting the threshold voltage of the first memory cell, which uses the first reference voltage as a reference, to the lower bit line, and reflecting the threshold voltage of the second memory cell, which uses the second reference voltage as a reference, to the upper bit line; and B2) flipping the lower latch data using a voltage level of the lower bit line resulting from step B1), and flipping the upper latch data using a voltage level of the upper bit line resulting from step B1).

7. The method of claim 6, wherein step C) further comprises:

C1) reflecting the upper latch data, flipped at step B2), to the lower bit line; and C2) flipping the lower latch data using a voltage level of the lower bit line resulting from step C1).

8. The method of claim 5, further comprising:

D) of recognizing the lower latch data flipped at step C).

9. The method of claim 5, wherein the non-volatile semiconductor memory device is a NAND type memory device.

10. A method of driving a non-volatile semiconductor memory device, the method comprising:

A) selecting a pair of first and second memory cells to which data of a set of first, second, and third bits are mapped in a write operation, wherein a first bit line is connected to the first memory cell and a second bit line is connected to the second memory cell; and B) controlling first and second word lines, applied to the first and second memory cells, to first and second reference voltages simultaneously during a read operation, the first and second reference voltages having different voltage levels wherein the first and second word lines are different word lines wherein the first reference voltage is lower than the second reference voltage.

11. The method of claim 10, wherein a switch is connected in series between the first bit line and the second bit line, the method further comprising:

electrically connecting and disconnecting the first bit line and the second bit line.

* * * * *